United States Patent [19]

Besser et al.

[11] Patent Number: 5,582,881
[45] Date of Patent: Dec. 10, 1996

[54] PROCESS FOR DEPOSITION OF A TI/TIN CAP LAYER ON ALUMINUM METALLIZATION AND APPARATUS

[75] Inventors: Paul R. Besser, Cupertino; Raymond Lee, Sunnyvale; Khanh Tran, San Jose, all of Calif.

[73] Assignee: Advanced Micro Devices, Inc., Sunnyvalle, Calif.

[21] Appl. No.: 602,200

[22] Filed: Feb. 16, 1996

[51] Int. Cl.$^6$ .................................................. H05H 1/24
[52] U.S. Cl. .................. 427/576; 118/719; 118/723 R; 118/723 VE; 427/124; 427/126.1; 427/250; 427/255.2; 427/255.7; 427/294; 427/404; 427/419.7; 427/585
[58] Field of Search ................................. 427/576, 585, 427/124, 126.1, 250, 255.2, 255.7, 294, 404, 419.7; 118/719, 723 R, 723 VE

[56] References Cited

U.S. PATENT DOCUMENTS

| 4,673,623 | 6/1987 | Gardner et al. | 428/620 |
| 5,071,714 | 12/1991 | Rodbell et al. | 428/620 |
| 5,360,995 | 11/1994 | Grass | 257/751 |

FOREIGN PATENT DOCUMENTS

0598422A1 5/1994 European Pat. Off. .

OTHER PUBLICATIONS

Howard et al., "Intermetallic Compounds of Al and Transitions Metals: Effect of Electromigration in 1-2-μM-Wide Lines", J. Appl. Phys. 49(7), Jul. 1978, pp. 4083-4093.
Gardner et al., "Homogeneous and Layered Films of Aluminum/Silicon With Titanium for Multilevel Interconnects", V-MIC Conf., Jun. 25-26, 1985, pp. 102-113.
Tracy et al., "Texture in Multilayer Metallization Structures", J. Appl. Phys. 76(5), Sep. 1994, pp. 2671-2680.
Shih, et al., "Ti/Ti–N Hf/Hf–N and W/W–N Multilayer Films with High Mechanical Hardness", Applied Physics Letters, vol. 61, No. 6, 10 Aug. 1992, pp. 654–656.
Massiani, et al., "Effect of a Titanium Underlayer on the Corrosion Behaviour of Physically Vapour Deposited Titanium Nitride Films", Thin Solid Films, vol. 217, No. 1/02, 30 Sep. 1992, pp. 31–37.
Maheo, et al., "Microstructure and Electrical Resistivity of TiN Films Deposited on Heated and Negatively Biased Silicon Substrates", Thin Solid Films, vol. 237, No. 1/02, 1 Jan. 1994, pp. 78–86.
Hultman, et al., "Interfacial Reactions in Single–Crystal–TiN(100)Al/Polycrystalline–TiN Multilayer Thin Films", Thin Solid Films, vol. 215, No. 2, 14 Aug. 1992, pp. 152–161.
Joshi, et al., "Collimated Sputtering of TiN/Ti Liners into Sub–Half–Micrometer High Aspect Ratio Contacts/Lines", Applied Physics Letters, vol. 61, No. 21, 23 Nov. 1992, pp. 2613–2615.
Licata et al., "Dual Damascene Al Wiring for 256M DRAM", VMIC Conference, 1995 ISMIC–104/95/0596, Jun. 27–29, 1995, pp. 596–602.
Eizenberg et al., "Chemical Vapor Deposited TiCN: A New Barrier Metallization for Submicron Via and Contact Applications", J. Vac. Sci. Technol. A 13(3), May/Jun. 1995, pp. 590–595.
Sandhu et al., "Metalorganic Chemical Vapor Deposition of TiN Films for Advanced Metallization", Appl. Phys. Lett. 62(3), 18 Jan. 1993, pp. 240–242.

(List continued on next page.)

*Primary Examiner*—Bernard Pianalto
*Attorney, Agent, or Firm*—Skjerven, Morrill, MacPherson, Franklin & Friel; Paul J. Winters

[57] ABSTRACT

A single chamber of a vapor deposition system is used to deposit both Ti and TiN, subsequent to deposition of Al or Al alloy. Because such layers are deposited in the same chamber, the process requires fewer handling steps than the conventional process, thereby increasing throughput. Still further, only three physical vapor deposition chambers of the four of the apparatus are used, thereby allowing the fourth chamber to be used for other deposition.

11 Claims, 2 Drawing Sheets

OTHER PUBLICATIONS

Hoshino et al., "Hyper(111)–Textured Al Interconnects by Reflowed Al on the CVD–TiN/cvd–Ti Film", VMIC Conference, 1995 ISMIC–104/95/0589, Jun. 27–29, 1995, pp. 589–593.

Inoue et al., "Behavior of TiN and Ti Barrier Metals in Al–Barrier–Al Via Hole Metallization", J. Electrochem. Soc., vol. 141, No. 4, Apr. 1994, pp. 1056–1061.

Ho et al., "Sputtered Metallurgy Process for Electromigration Improvement of Al–Cu Interconnections", IBM Technical Disclosure Bulletin, vol. 21, No. 11, Apr. 1979, pp. 4527–4528.

Gniewek et al., "Titanium Overlay on Metallurgy", IBM Technical Disclosure Bulletin, vol. 13, No. 5, Oct. 1970, p. 1124.

Brouillard, et al., "Thin Film Metallurgy with Sandwich Barrier Layer", IBM Technical Disclosure Bulletin, vol. 21, No. 2, Jul. 1978, p. 576.

Rodbell et al., "Texture Effects on the Electromigration Behavior of Layered Ti/AlCu/Ti Films", Mat. Res. Soc. Symp. Proc., vol. 265, 1992, pp. 107–113 (no month avail.).

Shen et al., "A Highly Reliable Aluminum Metallization for Micron and Submicron VLSI Application", V–MIC Conf., CH 2337–4/86/0000–0191, Jun. 9–10, 1986, pp. 191–197.

Inoue et al.,"Effects of TiN/Ti Cap Layers on Improving Electromigration in Al Based Multi–layered Interconnects", VMIC Conference, 1994 ISMIC–103/94/0275, Jun. 7–8, 1994, pp. 275–277.

Hewes et al., "Interaction of Titanium Cap and Aluminum Alloys with Tin Barrier Layer on Annealed Metal Sheet Resistance and on Electromigration", VMIC Conference 1994 ISMIC–103/94/0278, Jun. 7–8, 1994, pp. 278–280.

Estabil et al., "Electromigration Improvements with Titanium Underlay and Overlay in Al(Cu) Metallurgy", VMIC Conference, TH–0359–0/91/000–0242, Jun. 11–12, 1991, pp. 242–248.

5,582,881

PROCESS FOR DEPOSITION OF A TI/TIN CAP LAYER ON ALUMINUM METALLIZATION AND APPARATUS

FIELD OF THE INVENTION

This invention relates to deposition methods for manufacturing integrated circuits, and particularly, to a method for depositing Titanium and Titanium Nitride stacks.

RELATED CASES

This case is related to U.S. application Ser. No. 08/347,781 filed Nov. 30, 1994, entitled PROCESS FOR IN-SITU DEPOSITION OF A Ti/TiN BARRIER METAL STACK, invented by Besser et al., U.S. patent application Ser. No. 08/393,625, filed Feb. 24, 1995, entitled PROCESS FOR IN-SITU DEPOSITION OF A Ti/TiN/Ti ALUMINUM UNDERLAYER.

BACKGROUND OF THE INVENTION

As semiconductor device geometries approach 0.25 μm minimum feature size, increased attention has focused on the difficulty in fabricating reliable, high-performance, cost-effective, and manufacturable metallization stacks. The stacks have evolved from a simple single-layer aluminum alloy. Aluminum alloys remain the low-resistivity interconnect of choice; however, improvements in the multilayer scheme have led to aluminum alloy sandwiched between carefully chosen underlayers and overlayers. Underlayers such as Ti and Ti/TiN have been shown to increase the electrical performance of the interconnect (typical metric being electromigration resistance) by improving the grain structure (or crystallographic texture) of the Al (for reference, see for instance Rodbell et al. or Tracy et al.) and the grain size. In the unlikely event that a void should form in the Al metallization during testing or under operation, this underlayer also serves as a shunt layer and permits continuous current flow.

The overlayer has also evolved from a multilayer of Ti and Al or both, to containing a refractory such as TiN. The purpose of the overlayer is to reduce hillock formation and to behave as an antireflective coating (ARC) for lithography. In addition, since multilevel metallizations are commonplace and current must pass from one level of metallization to another through a plug (typically made of tungsten plus barrier metallization) and the overlayer, it must be comprised of sufficiently low resistance material.

As the dimensions of these vias or plugs reduce, the resistance of a typical circuit path is being dominated by the resistance of the plugs. Including more levels of plugs (driven by ever increasing number of metal layers) or reducing the dimensions of the metal interconnect lines leads to a higher resistance of the total connection. Therefore, it is important that the resistance of all layers in the current path be reduced.

It has recently been observed and published that highly-resistive Al-N forms between the Al and the TiN ARC. When a nitrogen plasma is struck above the Al-coated wafer during TiN reactive-sputtering, the formation energy of Al-N is lowered. This presence of Al-N was demonstrated by Inoue et al. using X-Ray Photoelectron Spectroscopy (XPS). It was also demonstrated in this work that the Al-N can be alleviated by the deposition of a Ti layer between the Al and the TiN in the metallization stack. This was shown to reduce the via resistance.

Furthermore, the inclusion of a Ti layer between the Al and the TiN improves the electromigration resistance. Also, the Ti under the TiN, which will react to form $TiAl_3$, has served as an etch stop during subsequent processing.

The results of recent electromigration studies suggest that a leading candidate for the next generation metal stack is substrate/Ti/Al (or Al alloy)/Ti/TiN (FIG. 1). However, manufacturing such a metal stack using conventional processes presents some throughput problems. A typical deposition system for forming metal stacks has four physical vapor deposition chambers. Thus, using a conventional process (where a separate deposition chamber is used for each layer), all four chambers would be used to deposit the stack. FIG. 2 illustrates this conventional process. In step (i), a wafer (also referred to as a sample) 100 is moved into chamber 110 for underlayer (for example, Ti) deposition. In step (ii), wafer 100 is moved into chamber 120 for aluminum or aluminum alloy deposition. In step (iii), wafer 100 is moved into chamber 130 for Ti deposition, and in step (iv), wafer 100 is moved chamber 140 for TiN deposition. As a result, the system's throughput is limited because each wafer must be moved in and out of a chamber at least four times to form the underlayer/Al (or Al alloy)/Ti/TiN stack.

Additionally, because all four chambers are utilized for the metallization scheme, the flexibility of the system is greatly reduced.

Copending application "A PROCESS FOR IN-SITU DEPOSITION OF A Ti/TiN BARRIER METAL STACK", Ser. No. 08/347,781, filed on Nov. 30, 1994 by Paul R. Besser et al., discloses a process for IN-SITU deposition of a Ti/TiN barrier metal stack that avoids the throughput problems of the conventional processes described in conjunction with FIG. 2. Although the process disclosed in copending Application Ser. No. 08/347,781 is a great improvement over conventional processes, improvements in electrical characteristics, such as via resistance and electromigration performance are always desirable.

SUMMARY OF THE INVENTION

In accordance with the present invention, provided is a method for using a single chamber of a physical vapor deposition system to deposit two layers comprising Ti and TiN, and an apparatus for practicing the method.

According to one embodiment of the invention, in a single chamber, a Ti layer is deposited. $N_2$ gas is then introduced into the chamber, and a TiN layer is then deposited over the Ti layer.

Because both layers are deposited in the same chamber, the process requires fewer handling steps than the conventional process illustrated in FIG. 2, thereby increasing throughput. Still further, only three physical vapor deposition chambers of the four of the apparatus are used, thereby allowing the fourth chamber to be used for other deposition.

DETAILED DESCRIPTION OF THE INVENTION

Figure 3:
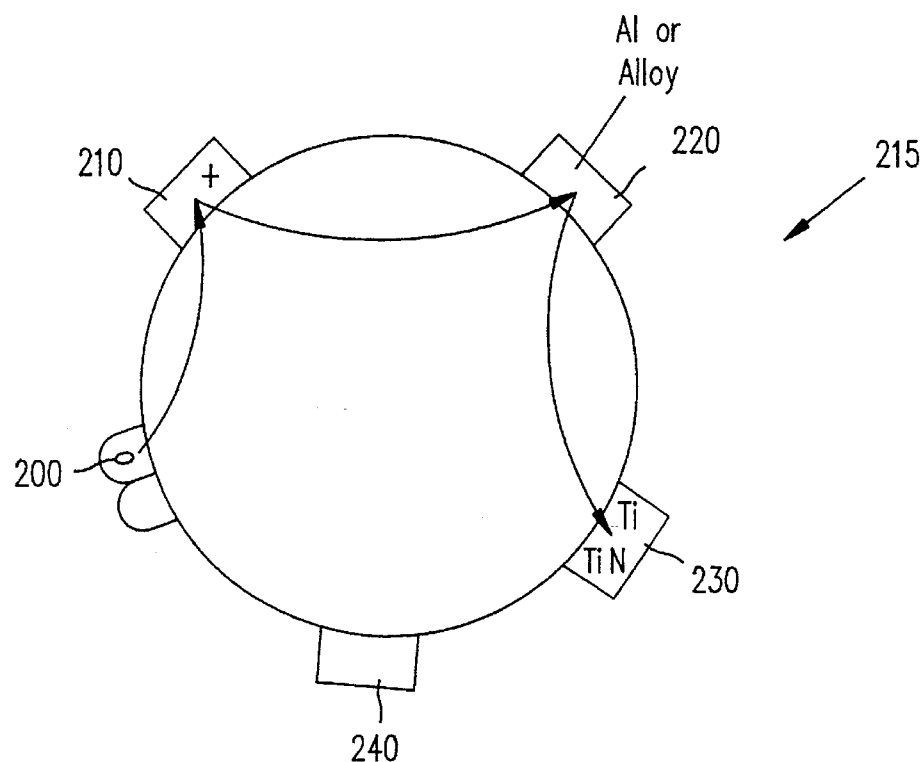
FIG. 3 illustrates a process flow for a single chamber Ti/TiN deposition using one embodiment of the present invention in a deposition system having four physical vapor deposition chambers.

FIG. 3 illustrates the process flow for Ti/TiN deposition using one embodiment of the present invention in a deposition system having four physical vapor deposition chambers. In step A, the wafer 200 is moved into a chamber 210 of a device 215 for underlayer (for example Ti) deposition. A robot arm (not shown) is used to move wafer into and out of the chambers. In step B, wafer is moved into chamber 220 for another deposition. In this application, chamber 220 is used for aluminum or aluminum alloy deposition.

Figure 1:
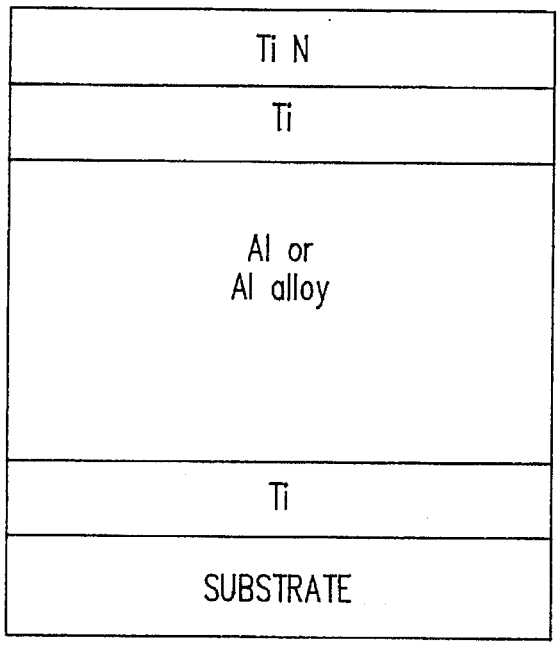
FIG. 1 shows a cross section of a metal stack in accordance with the present invention.
Figure 2:
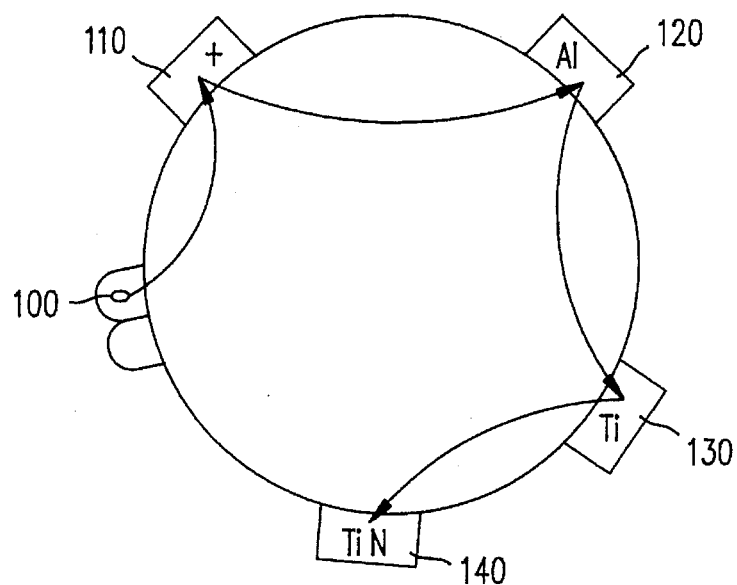
FIG. 2 (prior art) illustrates a process flow of a conventional process using a separate physical vapor deposition chamber for each layer.

In step C, wafer is moved into chamber 230 for another deposition. In this application, chamber 230 is used for Ti deposition. In addition, chamber 230 is used for TiN deposition. Throughput is increased in the process of FIG. 3 as compared to the process of FIG. 2 because the system of FIG. 3 requires one fewer handling step. Still further, a fourth chamber 240 is left available for other metal depositions without disrupting concurrent use of the three other chambers 210, 220, 230.

Figure 4:
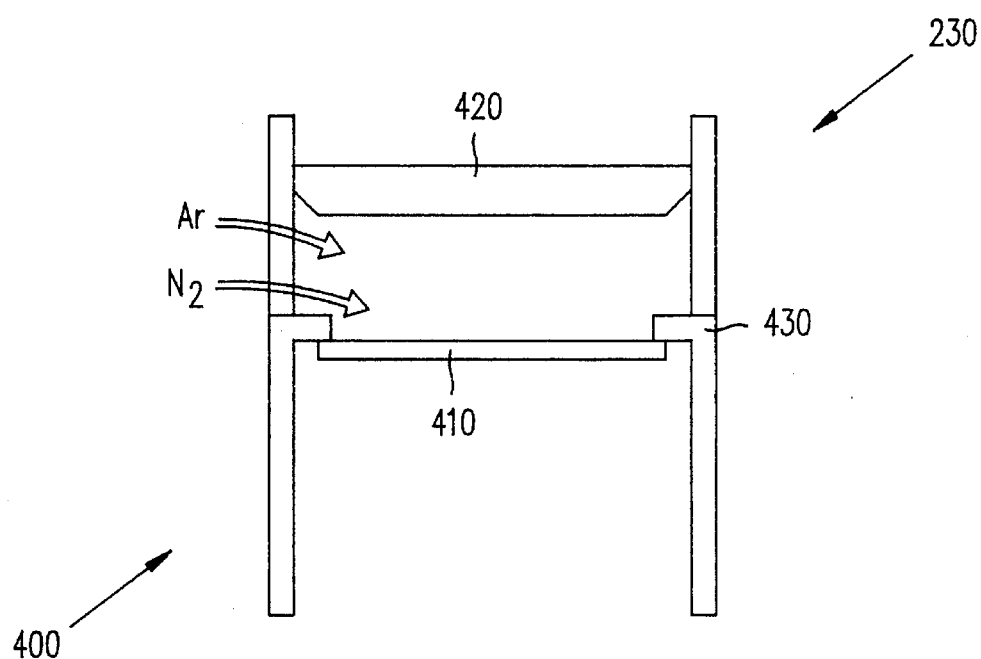
FIG. 4 shows a Ti/TiN physical vapor deposition chamber according to one embodiment of the present invention.

FIG. 4 shows a vapor deposition system 400 according to one embodiment of the present invention, using multiple physical vapor deposition chambers on a single system, such as the Endura 5500 made by Applied Materials, Inc. Of course, physical vapor deposition chambers or systems available from other manufacturers may be used instead. In physical vapor deposition system 400, wafer or sample 410 is held approximately mm from Ti target 420 by a heater clamp 430. For this embodiment, the steps for a typical same chamber Ti/TiN deposition are summarized in Table 1 below.

TABLE 1

| Step | BSP | Preheat | Ti-Dep | Gas | TiN-Dep | BSP |
|---|---|---|---|---|---|---|
| Time (sec) | 2 | 15 | 4.0 (Variable) | 5.0 | 42 (Variable) | 4.0 |
| Power (W) | 0 | 0 | 3000 | 0 | 6500 | 0 |
| Power Rate (W/s) | 0 | 0 | 3000 | 0 | 6500 | 0 |
| Gas Flow | | | | | | |
| Heated Ar | −2 PV | 15 | 15 | 15 | 15 | −2 PV |
| Ar | | | | 34 | 34 | −2 PV |
| $N_2$ | | | | 90 | 90 | −2 PV |

In the first BSP step, the gas lines for providing various gases to the chamber are closed and the heated Ar gas line is evacuated to the final valve of the gas line to a pressure of approximately $10^{-8}$ Torr (−2 PV). As a result, the chamber 230 is evacuated to a base pressure of approximately $10^{-8}$ Torr. This step takes approximately 2 seconds to complete.

In the Preheat Step, sample 410 is placed against the heater clamp 420, and 15 SCCM (standard cubic centimeters per minute) of heated Ar gas is supplied into the chamber 230 below sample 410 to preheat sample and maintain a pressure differential to keep sample in contact with heater clamp 430 (heated Ar is preferred but is not necessary). In this embodiment, sample 410 is heated to approximately 350° C., but any temperature may be used depending on the coverage and film quality desired. Typically, a temperature in the range of 25°–450° C. is suitable. A preferred target-to-sample spacing of 52 mm is maintained, but other spacing may be used. This spacing is the optimized spacing for TiN deposition for the power and magnet (not shown) in this process. Ar gas is introduced into the chamber above the sample 410 for generating a plasma. In this embodiment, 50 SCCM of Ar gas is used, although any flow of Ar gas can be used so long as enough Ar gas is provided to create a suitable plasma. Typically, an Ar gas flow in the range of 40–100 SCCM is suitable. This step takes approximately 15 seconds.

In the first Dep step, Ti is deposited on sample 410. A plasma is created in the chamber 230 by applying a voltage across the Ti target 420 and sample 410. In this embodiment, a 3000 W plasma is used, although any power level can be used depending on the sputtering rate and coverage desired. Typically, a power level greater than 1000 W is suitable. A suitable plasma pressure can be anywhere from a few to several hundred mTorr. No collimator is necessary, which if used, would slow down the deposition process thereby reducing throughput. The Ar and heated Ar gas flows are maintained and a 100 Å thick layer of Ti is deposited on sample 410 after approximately 4.0 seconds.

The above Ti thickness and corresponding time is a typical embodiment of the invention. The actual thickness limits are constrained by manufacturability for thin Ti layers and by metal resistance for thick Ti layers, since Ti and Al react to form $TiAl_3$ (which consumes the Al alloy).

In the Gas step, the plasma is terminated by terminating the power, and $N_2$ gas is introduced into the chamber 230. As a result, Ti target 420 is placed in a "Nitrided" mode for TiN deposition. In this embodiment, 90 SCCM of $N_2$ flow is used, although any gas flow can be used that provides sufficient N under the existing conditions to place Ti target 420 into nitrided mode. Typically, a $N_2$ gas flow in the range of 60 and 200 SCCM is suitable. The Ar flow is reduced to a lower value (34 SCCM).

In the second Dep step, TiN is deposited on sample 410. A plasma is created by applying a voltage across the nitrided Ti target 420 and sample 410. In this embodiment, a 6500 W plasma is used because of the lower sputtering rate of TiN (compared to Ti). Again, any power level can be used depending on the sputtering rate and coverage desired. Typically, a power level greater than 5000 W is used to achieve a suitable sputtering rate. The $N_2$, Ar and heated Ar gas flows are maintained and after approximately 42 seconds, 1000 Å of TiN is deposited on sample 410. 1000 Å TiN is the preferred embodiment. However, actual thickness depends on process integration. The actual thickness can vary from 250 Å to 1500 Å.

In the second BSP step, the plasma is terminated and the gas lines closed. The Ar and $N_2$ gas lines are evacuated to the final valve of the gas-line, and consequently, the chamber 230 is no longer flooded with $N_2$ gas. Thus, Ti target 420 is left in a semi-nitrided mode. This step takes approximately 4 seconds to complete.

It has been observed for the same chamber Ti/TiN deposition process that the Ti/TiN layer formed thereby is slightly different from a Ti/TiN layer formed by deposition in separate chambers. The main differences are that the Ti layer from the same chamber has degraded uniformity (i.e., the variation in the layers' thickness is increased) and also it has been noted that incorporation of approximately 3 to 20 at % of nitrogen has taken place.

The degradation in uniformity is attributable at least in part to the 52 mm TiN target-to-sample spacing (rather than the optimal 43 mm Ti target-to-sample spacing) used in the same chamber Ti/TiN deposition process. Separate chamber Ti/TiN deposition has an observed sheet resistance uniformity of approximately 1.5% 1 σ as compared to approximately 3.1% 1 σ for same chamber Ti/TiN deposition. A uniformity of 3.1% 1 σ is acceptable for many applications.

Moreover, when Al is included in the stack, the observed sheet resistance uniformity is approximately 1.4% 1 σ, which is excellent under current standards. Further, studies show that the degraded uniformity of the Ti/TiN layer does not substantially compromise (and in some aspects improves) the quality (e.g., electromigration properties) of the Al layer in the Ti/Al/TiN stack. This in-situ method of depositing Ti/TiN ARC has the manufacturing benefits indicated herein while retaining the preferable aspects of use of a separate chamber, i.e., elimination of Al-N which leads to substantial improvement in via resistance and improved EM performance as a result of Ti-Al reaction when compared to single layer TiN ARC.

What is claimed is:

1. A method of depositing an underlayer, aluminum or aluminum alloy, titanium, and titanium nitride in sequence on a sample comprising:

positioning a sample in a first chamber;

depositing an underlayer on the sample in the first chamber;

positioning the sample in a second chamber;

depositing aluminum or aluminum alloy on the underlayer in the second chamber;

positioning the sample in a third chamber;

depositing titanium on the aluminum or aluminum alloy in the third chamber; and depositing titanium nitride on the titanium in the third chamber.

2. The method of claim 1 wherein the step of depositing the titanium on said aluminum or aluminum alloy comprises providing a target in the third chamber.

3. The method of claim 2 and further comprising the step of introducing $N_2$ gas into the third chamber during the step of depositing titanium nitride on the titanium.

4. The method of claim 3 wherein the step of depositing titanium comprises the step of creating a plasma in the third chamber between the target and the sample.

5. The method of claim 4 wherein the step of creating a plasma comprises the steps of introducing argon gas into the third chamber and providing electrical power in the chamber.

6. A device for depositing an underlayer, aluminum or aluminum alloy, titanium, and titanium nitride in sequence on a sample comprising:

an apparatus including first, second and third chambers;

means for depositing an underlayer on the sample in the first chamber;

means for depositing aluminum or aluminum alloy on the underlayer in the second chamber;

means for depositing titanium on the aluminum or aluminum alloy in the third chamber; and means for depositing titanium nitride on the titanium in the third chamber.

7. The device of claim 6 wherein the apparatus comprises a fourth chamber.

8. The device of claim 6 and further comprising a target in the third chamber.

9. The device of claim 8 and further comprising means for creating a plasma in the third chamber between the target and the sample.

10. The device of claim 9 and further comprising means for introducing $N_2$ gas into the third chamber during the step of depositing titanium nitride on the titanium.

11. The device of claim 10 wherein the means for creating the plasma in the third chamber comprise means for introducing argon gas into the third chamber and providing electrical power in the third chamber.

* * * * *